United States Patent
Flottmann et al.

(10) Patent No.: US 6,265,683 B1
(45) Date of Patent: Jul. 24, 2001

(54) SEMICONDUCTOR MATERIAL CLASSIFICATION DEVICE

(75) Inventors: Dirk Flottmann, Altötting; Karl Hesse, Burghausen; Matthäus Schantz, Reut, all of (DE)

(73) Assignee: Wacker-Chemie GmbH, München (DE)

(*) Notice: Subject to any disclaimer, the term of this patent is extended or adjusted under 35 U.S.C. 154(b) by 0 days.

(21) Appl. No.: 09/388,207

(22) Filed: Sep. 1, 1999

(30) Foreign Application Priority Data

Sep. 3, 1998 (DE) .............................. 198 40 200

(51) Int. Cl.[7] ...................................................... B07C 5/00
(52) U.S. Cl. ................... 209/576; 209/577; 209/639; 209/939; 209/587; 382/149; 382/108; 382/145
(58) Field of Search .................... 209/587, 576, 209/577, 639, 939

(56) References Cited

U.S. PATENT DOCUMENTS 6,040,544 * 3/2000 Schantz et al. ....................... 209/577
6,148,099 * 11/2000 Lee et al. .............................. 382/149

FOREIGN PATENT DOCUMENTS

| 0 325 453 A2 | 7/1989 | (EP) . |
| 0 448 918 A1 | 10/1991 | (EP) . |
| 0 611 160 A2 | 8/1994 | (EP) . |
| 0 876 851 A1 | 11/1998 | (EP) . |
| 2 246 230 | 1/1992 | (GB) . |

OTHER PUBLICATIONS

English Derwent Abstract AN 98–570369149 corresponding to EP 0876851 A1.

Patent Abstract of Japan, vol. 18, No. 574 (P–1821), Nov. 2, 1994, JP 06213637 (Tokyo Gas Co. Ltd.) Aug. 5, 1994.

* cited by examiner

Primary Examiner—Donald P. Walsh
Assistant Examiner—Jonathan R Miller
(74) Attorney, Agent, or Firm—Brooks & Kushman P.C.

(57) ABSTRACT

A device for the optoelectronic classification of semiconductor materials, which has an identifying device 6 that forwards the morphology of the product 1 to be classified to an evaluating device 7 which evaluates the data.

21 Claims, 1 Drawing Sheet

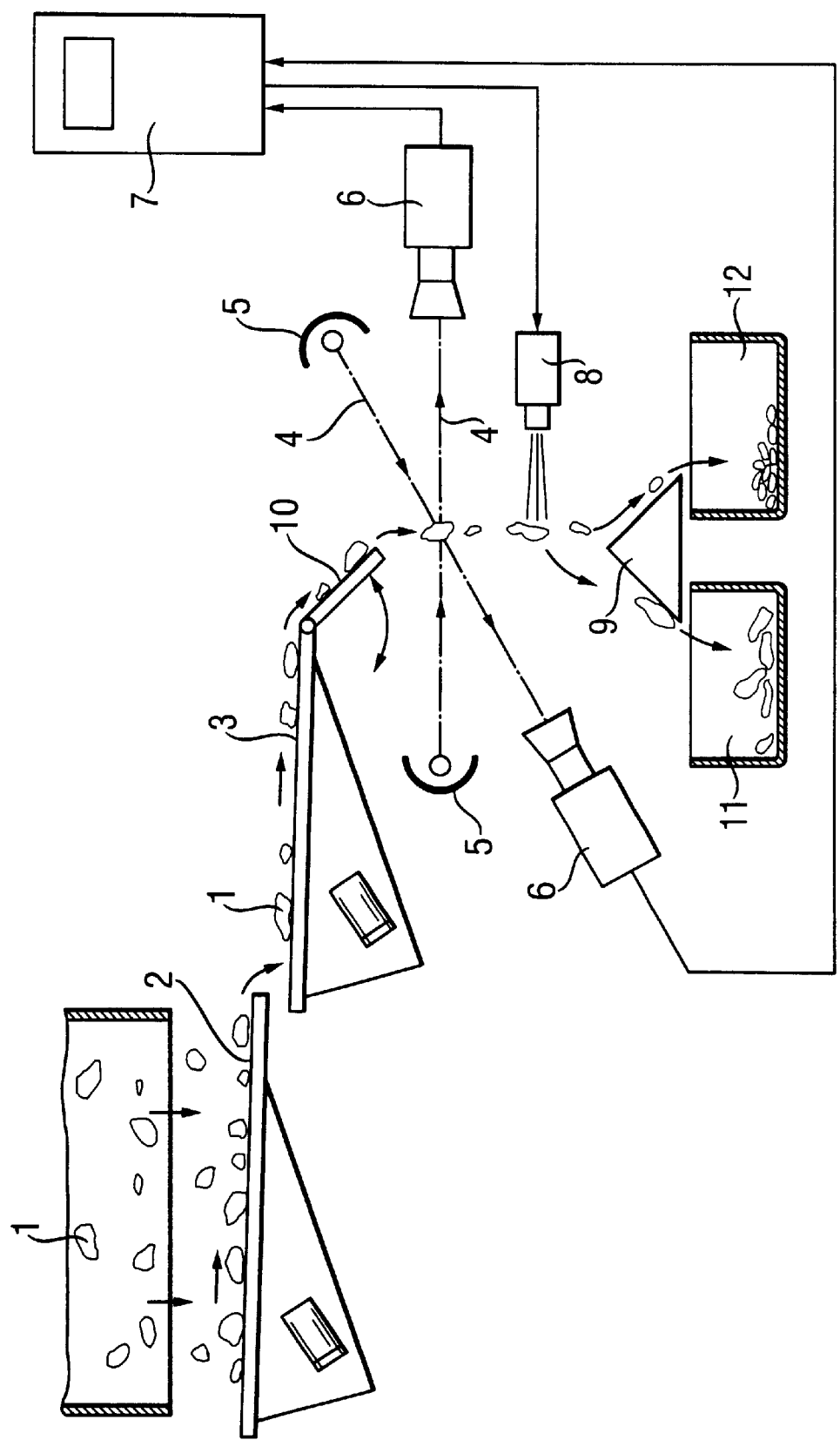

SEMICONDUCTOR MATERIAL CLASSIFICATION DEVICE

TECHNICAL FIELD

The invention relates to a device and to a method for the optoelectronic classification of semiconductor materials.

BACKGROUND ART

In order to produce monocrystalline ingots from polycrystalline ingots, the polycrystalline ingots are broken up into fragments of about 100 mm diameter. These fragments are used to fill a crucible in Czochralski crystal pulling (CZ crystal pulling). Since the surface of the ingots varies in roughness at different positions, the breaking gives rise to fragments which have these rough surface portions. At present, the parts with, for example, cracks, protrusions (popcorn), craters (verbal classification) etc. are manually sorted out by trained personnel before they reach the crucible for CZ crystal pulling, because this defective material causes quality reductions in the method there.

SUMMARY OF INVENTION

The object of the invention is to develop a device and a method which sorts out defective fragments without the use of subjective decisions by personnel. These and other objects are achieved by the invention.

BRIEF DESCRIPTION OF THE DRAWING

The FIGURE shows one embodiment of a device according to the invention.

DESCRIPTION OF THE PREFERRED EMBODIMENT

The invention relates to a device for the optoelectronic classification of semiconductor materials, which, with reference to the FIGURE, but not limited thereby, has an identifying device 6 that forwards morphology data of the product 1 to be classified to an evaluating device 7 which evaluates the data. The device is preferably used to classify brittle semiconductor materials, such as silicon, germanium or gallium arsenide, according to morphology, with preference to classifying silicon. With this device, semiconductor material can be segregated according to morphology, preferably with no subjective input from personnel.

The device is constructed in such a way that the product 1 to be classified is preferably first placed on a device 2 for separation, and preferably for simultaneous delivery, preference for such a device being given to a vibrating delivery apparatus. The vibration of the vibrating delivery apparatus separates and transports the fragmented semiconductor material to a conveyor 3 in the direction of the sliding plane 10. It is, however, also possible for the material to be placed already separated on a delivery device. The angle of the sliding plane 10 is preferably adjustable with respect to the horizontal; it is preferably set as a function of the coefficient of friction between the fragment and the surface coating in such a way that the fragments slide downward under the effect of gravity. The angle is preferably within the range of 20° to 80°, more preferably 30° to 70°.

The device 2 for separation, and preferably also for delivery, the conveyor 3, and the sliding plane 10, are constructed in such a way that the semiconductor material 1 to be classified does not come into contact with materials other than the material comprising the semiconductor material to be classified. This is preferably achieved by coating the respective devices with the same semiconductor material as the one intended to be classified. The separating device 2, the conveyor 3 and the sliding plane 10 may also be constructed in full from the corresponding semiconductor material. In the case of silicon, for example, the devices may be coated with silicon or may be constructed of silicon. On the sliding plane, the particles become oriented in such a way that their center of gravity comes to lie as low as possible. This means that, during their free fall after crossing the sliding plane 10, the semiconductor fragments present the maximum projection area to beam source 5 and are illuminated by at least one beam source 5. The height of fall between the sliding plane 10 and deflecting device 8 is preferably from 5 cm to 20 cm, preferentially 10 cm. About halfway down this fall path, a beam source 5 and a shape-recognition device 6 are arranged, the particle moving between the beam source 5 and the shape-recognition device 6. The distance between the particle and the beam source 5 is preferably from 50 cm to 120 cm, more preferably about 70 cm, and the distance between the particle and the shape-recognition device 6 is preferably from 5 cm to 12 cm, particularly preferentially 6 cm. The beam source 5 is preferably an electromagnetic beam source, such as a laser or a lamp, which emits visible light in the 400 nm to 700 nm range.

The identifying device 6 is preferably at least one high-resolution sensor, which may be a discrete semiconductor sensor or CCD linear sensor, which may be contained in one or more cameras, in order to detect visible light which is reflected as reflection light by the surface of the fragments. This sensor is connected to an evaluating device 7 which evaluates the incoming data and automatically converts them into a binary image. This evaluating device 7 is preferably a computer. More than one evaluating device may be used.

One digital method for evaluating the wave components which are created by the interaction between light and "popcorn" defects is the manipulation of data series by the discrete Fourier transform method. The latter provides a data series in ascending order of frequency.

The evaluating device 7 controls at least one classification means, preferably at least one deflecting device 8 according to a predetermined program. In this case, this detection system made up of the evaluating device 7 and identifying device 6 can identify a specific morphology such as craters, hills, cracks or "popcorn", preferably using fuzzy logic. The intensity and resolution required to image holes, hills and furrows in the binary image can be established in the evaluating device. Using the deflecting device 8, it is possible to pick out a fragment, the number and depth of the material not complying morphologically to the specification determining whether or not it is sorted out.

The deflecting device 8 is preferably a nozzle from which fluids such as gases or liquids are ejected, the gases being preferably air, or alternatively, inert gases such as nitrogen, which are ejected at a pressure higher than standard pressure, preferably at 3 to 10 bar, particularly preferentially at about 6 bar. In the case of liquids, high-purity water, with a conductance of preferably below 0.14 $\mu$S, particularly preferentially 0.08 $\mu$S, is preferably ejected at a pressure of preferably 2 to 20 bar. In a particular embodiment, a particle which is too large is sprayed with a water jet at preferably 1500 bar to 5000 bar, particularly preferentially 3500 bar, and thereby comminuted. The deflecting device 8 may be arranged on its own or consist of a plurality of nozzles which are preferably arranged in a row with a spacing of preferably 3 to 15 mm, particularly preferentially 9 mm, if the particles fall parallel through the optical path from the beam source 5.

The deflected particles of the desired morphology are preferably gathered via a segregating device 9 in a collection container 11, and the undeflected particles are gathered in a collection container 12. The collection containers may have a surface made of the semiconductor material to be classified, at least in their interior, or may be constructed of this material. The two resolved product streams may be divided into further classes by further detecting systems and deflecting devices. It would also be possible, through the arrangement of further segregating devices, to obtain product segregation into a plurality of classes, the trajectory being resolved with different strengths of deflecting actions, preferably with different strengths of air impulses. This segregating device is preferably provided on its surface with the semiconductor material to be classified, or is constructed of this material.

The invention also relates to a method for the optoelectronic classification of semiconductor materials, wherein the product to be classified is detected using an identifying device 6 which identifies its morphology, and forwards this device to an evaluating device 7.

In the preferred method according to the invention, the comminuted product 1, in this case semiconductor material, is delivered to a separating device 2 and to the conveyor 3 onto a sliding plane 10 whose angle is preferably set as a function of the coefficient of friction between the semiconductor material and surface coating to be classified, in such a way that the semiconductor material to be classified preferably slides downward under the effect of gravity. In this case, the irregularly shaped semiconductor material becomes aligned in such a way that its center of gravity comes to lie as low as possible, that is to say it presents its maximum projection surface to the sliding plane 10. In this alignment, after leaving the sliding plane 10, the comminuted product passes through the detection system, which consists of a beam source 5 and identifying device 6 and the optical path 4 from the beam source 5, the reflection light produced from the surface is measured in real time and classified, and is in this case detected by an identifying device 6 which preferably has an optical resolution of 0.1 mm to 20 mm, and particularly preferably an optical resolution of 0.5 mm to 10 mm. From the deviation of the light beams, the various heights and inclination angles of the faces are calculated. The resultant surface images are subjected to overall analysis, for example with the use of various filter techniques, so that a binary image is created from the real-time image. The resultant dark regions on the binary image of the polysilicon fragment are automatically investigated in terms of their morphology and number of defects.

Other viable optical methods for surface inspection include triangulation/split-beam methods or gray-scale image analysis. In the former case, a line fan, and in the latter case individual light points of electromagnetic radiation are directed at the fragments and focused there. The resultant profile section is detected in a matrix camera system. The measurable height differences on the object to be measured are determined by the observation angle and the resolution of the CCD sensor. In gray-scale image analysis, the object to be measured is illuminated not in a structured way (projected line pattern), but in a directional way, in order to identify the popcorn structure with the aid of shadow formation on the object. The spatial resolution which is needed for the detection lies in the micrometer to millimeter range with this method.

The equivocal verbal expressions used to describe defects can then preferably be associated by means of fuzzy-theory in such a way that linguistic terms such as craters, "popcorn", cracks etc. are represented by membership functions with modifiers. The number of faulty parts to be picked out are variable and the degree of picking out can be set. Nevertheless, it is possible to sort out a fragment even in the case of a surface defect for which fuzzy evaluation does not need to be carried out. As soon as "popcorn" or similar defects are identified and evaluated according to the binary morphological analysis, this fragment is sorted out, preferably with an air impulse. The obtained data is evaluated by an evaluating device 7. The semiconductor material to be classified passes through the detection system with a fall time of 0.05 sec to 1 sec, particularly preferentially 0.1 sec to 0.2 sec. Depending on the discrepancy of the particular morphology of the semiconductor material to be classified in comparison with the segregation criterion that has been set, at least one deflecting device 8 is operated, which for example deflects all the semiconductor material particles with popcorn with, for example, an air jet, and therefore causes deviation from the original trajectory. A segregating device 9 segregates the two fractions, which are gathered in separate collection containers 11, 12.

The method according to the invention, in conjunction with the device according to the invention, has the advantages that contamination-free classification can be carried out without subjective assessment by personnel.

What is claimed is:

1. A classifying device for the optoelectronic classification of irregularly shaped, broken semiconductor material fragments, comprising an identifying device that captures data corresponding to the surface morphology of said semiconductor fragments to be classified, and which forwards the captured data to an evaluating device which evaluates the data, the evaluating device generating a signal based on its evaluation of the data, said signal enabling said semiconductor fragments to be classified on the basis of their surface morphology.

2. The classifying device for the optoelectronic classification of semiconductor materials as claimed in claim 1, wherein the evaluating device 7 evaluates the data by means of fuzzy logic.

3. The classifying device as claimed in claim 1, comprising a separating device which separates said fragments spatially from each other, and a sliding plane, the separating device and the sliding plane each having a surface constructed of the same semiconductor material as the semiconductor material fragments to be classified; and an electromagnetic beam source through whose optical path the semiconductor fragments to be classified fall.

4. The classifying device as claimed in claim 1, wherein the evaluating device drives at least one deflecting device.

5. The classifying device of claim 1 comprising a separating means for separating said semiconductor fragments spatially from each other, said semiconductor fragments free-falling from said separating means through two beams of light, each of said beams of light having associated therewith an associated identifying device located on the same side of the path of said free-falling fragments such that said associated identifying device captures light reflected from said free-falling fragments, said two beams of light impinging upon said free-falling fragments from different sides of said fragments.

6. A method for the optoelectronic classification of irregularly shaped, broken semiconductor material fragments, wherein said semiconductor material to be classified is detected using an identifying device which captures data reflective of the surface morphology of said semiconductor material, and forwards said data to an evaluating device which distinguishes semiconductor materials from each other based on surface morphology.

7. The method for optoelectronic classification of semiconductor materials as claimed in claim 6, wherein the data are evaluated by means of fuzzy logic.

8. The method for the optoelectronic classification of semiconductor materials as claimed in claim 6, wherein the material is exposed to diffuse light and the identifying unit is a CCD linear sensor.

9. The method for the optoelectronic classification of semiconductor materials as claimed in claim 7, wherein the triangulation method is used as the optical method of surface inspection.

10. The method for the optoelectronic classification of semiconductor materials as claimed in claim 7, wherein the split-beam method is used as the optical method of surface inspection.

11. The method for the optoelectronic classification of semiconductor materials as claimed in claim 7, wherein the gray-scale image analysis method is used as the optical method of surface inspection.

12. The method for the optoelectronic classification of semiconductor materials as claimed in claim 6, wherein the material is exposed to diffuse light and the identifying unit is a CCD linear sensor.

13. The method for the optoelectronic classification of semiconductor materials as claimed in claim 6, wherein the triangulation method is used as the optical method of surface inspection.

14. The method for the optoelectronic classification of semiconductor materials as claimed in claim 6, wherein the split-beam method is used as the optical method of surface inspection.

15. The method for the optoelectronic classification of semiconductor materials as claimed in claim 6, wherein the gray-scale image analysis method is used as the optical method of surface inspection.

16. A method for the classification of semiconductor material fragments wherein a portion of said semiconductor material fragments have defects associated with an observable surface morphology, said method comprising:

free falling a separated stream of fragments past at least one illuminating source of electromagnetic radiation;

capturing light reflected from the respective individual fragments by a detection device;

forwarding an electrical data signal from the detection device to an evaluating device;

processing the electrical data signal in the evaluating device to identify the presence or absence of at least one surface morphology possessed by the respective individual fragments;

generating a classification signal based on the presence or absence of said at least one surface morphology; and directing said classification signal to a classifying device such that said semiconductor fragments are classified based on at least one of said at least one surface morphologies.

17. The method of claim 16, further comprising separating said semiconductor fragments into said separated stream employing a vibrating conveyor.

18. The method of claim 17, further comprising at least partially aligning said semiconductor fragments with respect to the fragment's centers of gravity by introducing said fragments onto a sliding plane maintained at an angle of from about 20° to about 80° in a downward direction from a horizontal plane.

19. The method of claim 17, wherein at least the surface of the vibrating conveyor is constructed of the same semiconductor material as that being classified.

20. The method of claim 16, wherein said classifying signal is directed to one or more jet nozzles which direct a deflecting jet of fluid against a semiconductor fragment, the strength of said deflecting jet of fluid sufficient in proportion to said classifying signal to effect classification of said semiconductor fragments based on their surface morphology.

21. The method of claim 16, wherein said detection device comprises a CCD linear sensor, said evaluating device comprises a computer, and wherein said computer evaluates said electrical data signal by means of fuzzy logic.

* * * * *